United States Patent
Wang et al.

(10) Patent No.: US 7,429,527 B2
(45) Date of Patent: Sep. 30, 2008

(54) METHOD OF MANUFACTURING SELF-ALIGNED CONTACT OPENINGS

(75) Inventors: Pin-Yao Wang, Hsinchu (TW); Liang-Chuan Lai, Hsinchu County (TW); Jeng-Huang Yang, Hsinchu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 0 days.

(21) Appl. No.: 11/853,025

(22) Filed: Sep. 11, 2007

(65) Prior Publication Data
US 2008/0003812 A1   Jan. 3, 2008

Related U.S. Application Data

(62) Division of application No. 11/306,095, filed on Dec. 15, 2005.

(30) Foreign Application Priority Data
Jun. 17, 2005   (TW) ................. 94120134 A

(51) Int. Cl.
*H01L 21/44* (2006.01)
(52) U.S. Cl. ................. 438/597; 438/304; 438/589; 438/596; 438/618

(58) Field of Classification Search ............. 438/304, 438/597, 589, 596, 618, 639
See application file for complete search history.

(56) References Cited

U.S. PATENT DOCUMENTS
7,098,124 B2 *  8/2006  Huang et al. ................. 438/597

* cited by examiner

*Primary Examiner*—Jack Chen
(74) *Attorney, Agent, or Firm*—Jianq Chyun IP Office

(57) ABSTRACT

A method of manufacturing self-aligned contact openings is provided. A substrate having a number of device structures is provided and the top of the device structures is higher than the surface of the substrate. A first dielectric layer and a conductive layer are sequentially formed on the surfaces of the substrate and the device structures. Next, a part of the conductive layers on the top and the sidewalls of the device structures is removed and a number of first spacers is formed on the exposed sidewalls of the device structures. The exposed conductive layer and the first dielectric layer are removed by using the first spacer as the mask to expose the substrate. Then, a number of conductive spacers is formed. A number of second spacers is formed on the sidewalls of the conductive spacers.

13 Claims, 4 Drawing Sheets

METHOD OF MANUFACTURING SELF-ALIGNED CONTACT OPENINGS

CROSS-REFERENCE TO RELATED APPLICATION

This application is a divisional of an application Ser. No. 11/306,095, filed on Dec. 15, 2005, now pending, which claims the priority benefit of Taiwan application serial no. 94120134, filed on Jun. 17, 2005. The entirety of each of the above-mentioned patent applications is incorporated herein by reference and made a part of this specification.

BACKGROUND OF THE INVENTION

1. Field of Invention

The present invention relates to a semiconductor device and the manufacturing process thereof. More particularly, the present invention relates to a method of manufacturing the self-aligned contact openings and the semiconductor device.

2. Description of Related Art

Along with the development of the technology of semiconductor, the size of the device is continuously reduced to deep submicron. The size of the current ultra large scale integration (ULSI) has been developed to 0.18 micron below. And, the more integrity of the integrated circuits, the smaller size of the contact openings of the metal and semiconductor. In general, the design of self-aligned contact (SAC) openings is applied to overcome the increasingly shrinking wire widths and to avoid misalignment of the contact openings.

FIG. 1A to FIG. 1C are the cross-sectional views of the conventional method of manufacturing self-aligned contact openings. Referring to FIG. 1A, first, a substrate 100 is provided. A plurality of device structures 102 and a plurality of doped regions 106 under the device structures 102 are formed on the substrate 100. Next, a dielectric layer 104, a conductive layer 108 and a silicon nitride layer 110 are sequentially formed on the surfaces of the substrate 100 and the device structures 102. Next, referring to FIG. 1B, an etching process is performed to form spacer 110a on the sidewall of the conductive layer 108. Next, an etching process is performed to form the conductor spacer 108a by using the spacer 110a as the mask, and the conductor spacer 108a exposes a top surface and a sidewall of the spacer 108a. Then, another spacer 112 is formed on the sidewall of the spacer 108a as protection. Meanwhile, the material of the spacer 112 also covers the exposed top surface of the conductive spacer 108a as protection. Next, referring to FIG. 1C, a dielectric layer 114 is formed on the substrate 100. Then, an etching process is performed to form the contact openings 116 in the dielectric layer 114 and to expose the substrate 100.

It is remarkable that the method of manufacturing self-aligned contact openings does not only avoid the problem of misalignment of the contact openings in a common photolithographic etching process, but also simplifies the manufacturing process because the use of a mask is omitted. Thus, the manufacturing cost is reduced. However, as the spacer material covered on the top surface of the conductive spacer 108a is thin, the spacer material covered on the top surface of the conductive spacer 108a would be continuously etched by the etchant in the self-aligned etching process when forming the contact openings, so as to expose the top of the conductive spacer 108a. Moreover, the contact interface 101 of the spacers 110a and 112 may be continuously etched by the etchant so as to expose the conductive spacer 108a. As a result, short circuit may occur between the contact opening plug and the conductive spacer 108a; the device performance is therefore affected.

SUMMARY OF THE INVENTION

Accordingly, the present invention is directed to provide a method of manufacturing self-aligned contact openings. Spacers with larger thickness are formed during the manufacturing process to prevent the conductive spacers from being exposed in the process of forming the contact openings. Thus, the problem of short circuit can be avoided.

Another object of the present invention is to provide a semiconductor device with thicker spacers which can protect the conductive spacers underneath the spacers; accordingly, the size of the devices is more likely to be shrunken.

A method of manufacturing self-aligned contact openings is provided. First, a substrate is provided. A plurality of device structures is formed on the substrate and the top of the device structures is higher than the surface of the substrate. Next, a first dielectric layer and a conductive layer are sequentially formed on the surfaces of the substrate and the device structures. Next, a part of the conductive layer on the top and the sidewalls of the device structures are removed. Next, a plurality of first spacers is formed on the exposed sidewalls of the device structures. Then, the exposed conductive layer and the first dielectric layer are removed by using the first spacer as the mask to expose the substrate; the remained conductive layer is formed into a plurality of conductive spacers. Then, a plurality of second spacers is formed on the sidewalls of the conductive spacers.

In the method of manufacturing self-aligned contact openings according to the embodiment of the present invention, the method of removing the part of the conductive layer on the top and sidewalls of the device structures by using the first spacer as the mask is, for example, performing a non-isotropic etching process.

In the method of manufacturing self-aligned contact openings according to the embodiment of the present invention, the method of removing the exposed conductive layer and the first dielectric layer is, for example, performing a non-isotropic etching process.

In the method of manufacturing self-aligned contact openings according to the embodiment of the present invention, the conductive layer is, for example, a multiple conductive layer, such as a polysilicon layer and a metal silicide layer on the polysilicon layer. Wherein, the material of the metal silicide layer is, for example, tungsten silicide.

In the method of manufacturing self-aligned contact openings according to the embodiment of the present invention, the plural device structures are, for example, trench devices.

In the method of manufacturing self-aligned contact openings according to the embodiment of the present invention, the material of the first spacers is, for example, silicon nitride.

In the method of manufacturing self-aligned contact openings according to the embodiment of the present invention, the material of the first dielectric layer is, for example, silicon oxide or silicon oxide/silicon nitride/silicon oxide.

In the method of manufacturing self-aligned contact openings according to the embodiment of the present invention, a second dielectric layer can further be formed on the substrate after the second spacer is formed.

In the method of manufacturing self-aligned contact openings according to the embodiment of the present invention, an etching process can be performed after the second dielectric layer is formed, so that a plurality of contact openings can be formed in the second dielectric layer; wherein, these contact openings are disposed between the two adjacent device structures and expose the substrate, the first spacers and the second spacers.

The present invention also provides another semiconductor device, comprising: a substrate, a device structure, a dielectric layer, a doped region, a conductive spacer and a first spacer. Wherein, the substrate has a trench. The device structure is disposed in the trench and the top of the device structure is higher than the surface of the substrate. The doped region is disposed in the substrate on the bottom of the device structure. The conductive spacer is disposed on the sidewall of the lower part of the device structure. The first spacer is disposed on the sidewall of the upper part of the device structure and covers the conductive spacer. The dielectric layer is disposed between the conductive spacer and the device structure, and also disposed between the conductive spacer and the substrate.

The semiconductor device according to the embodiment of the present invention further comprises a second spacer disposed on the sidewall of the conductive spacer.

In the semiconductor device according to the embodiment of the present invention, the device structures are, for example, gate structure, conductive wire structures or trench devices.

In the semiconductor device according to the embodiment of the present invention, the material of the first spacer is, for example, silicon nitride.

In the semiconductor device according to the embodiment of the present invention, the material of the dielectric layer is, for example, silicon oxide or silicon oxide/silicon nitride/silicon oxide.

In the semiconductor device according to the embodiment of the present invention, the doped region is, for example, a source region.

In the semiconductor device according to the embodiment of the present invention, the conductive spacer is, for example, a multiple conductive layer, such as a polysilicon layer and a metal silicide layer on the polysilicon layer. Wherein, the material of the metal silicide layer is, for example, tungsten silicide.

In the method of manufacturing self-aligned contact openings according to the embodiment of the present invention, a part of the conductive layer on the top and the sidewalls of the device structure are removed before the first spacer is formed so as to reserve a bigger space on the sidewall of the device structure. Accordingly, in the process of forming the self-aligned contact openings, the subsequently formed first spacer can have larger thickness. Thus, exposure of the conductive spacers due to the removal of the first spacers during the SAC manufacturing process can be prevented. Accordingly, the problem of short circuit resulting from the contact of conductive devices, i.e. the conductive spacer and the contact opening, is avoided. Moreover, the present invention also improves the feasibility of shrinking the size of devices.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
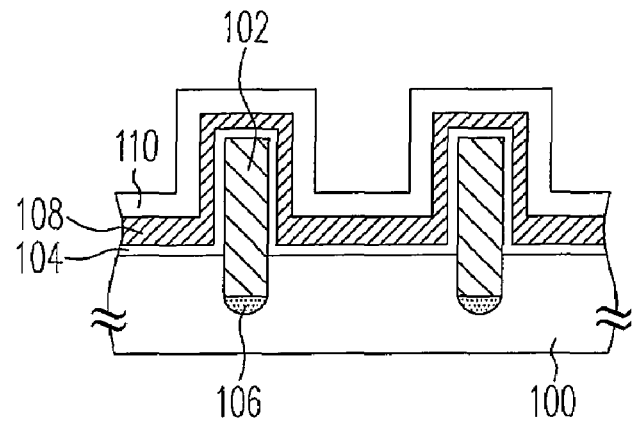
FIGS. 1A to 1C are cross-sectional diagrams showing the conventional method of manufacturing SAC openings.
Figure 1B:
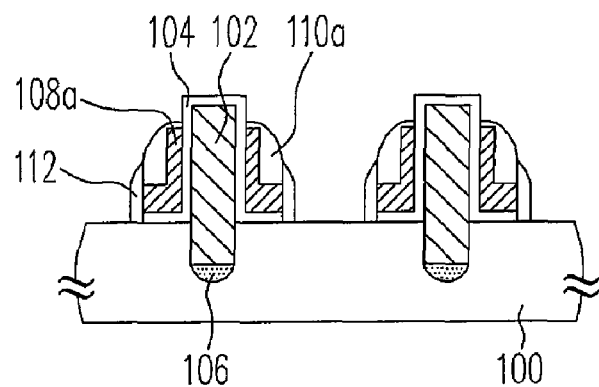
Figure 1C:
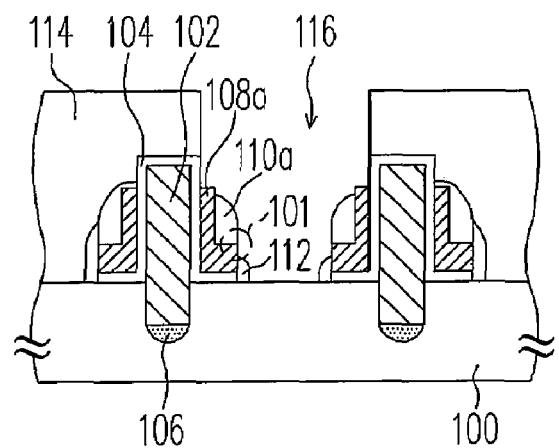
Figure 2A:
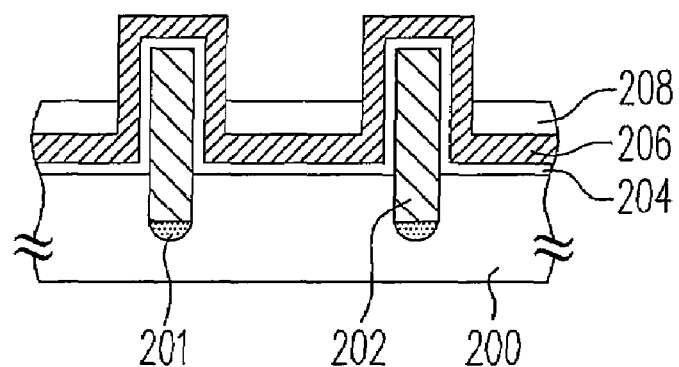
FIGS. 2A to 2E are cross-sectional diagrams showing the method of manufacturing SAC openings according to the embodiment of the present invention.
Figure 4:
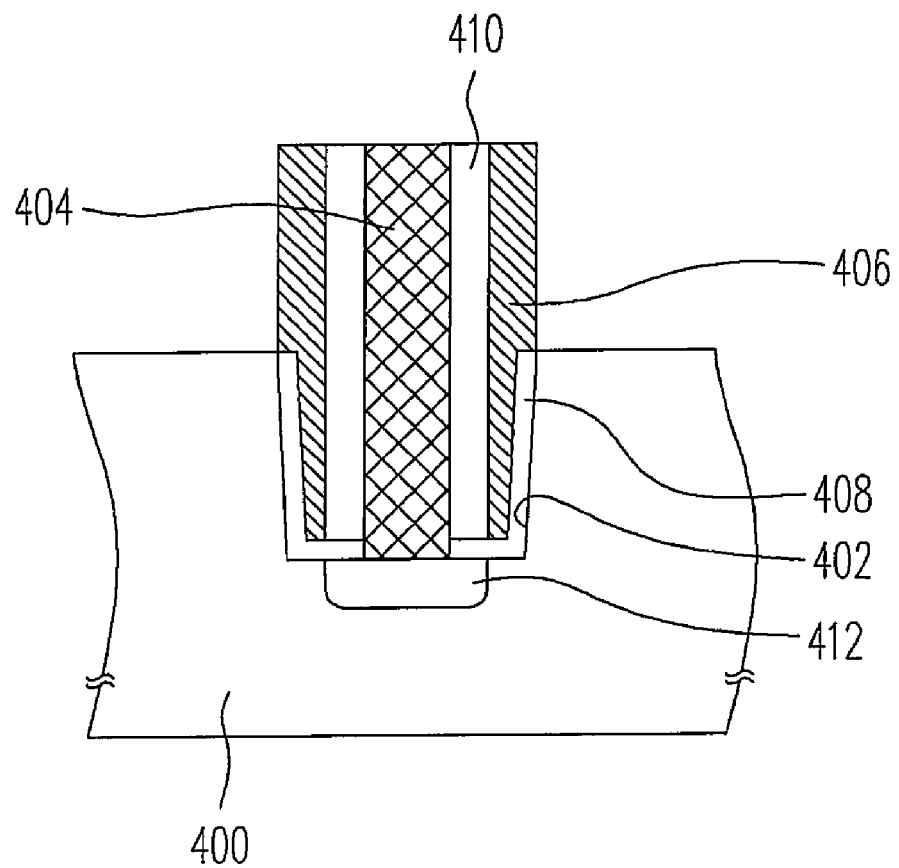
FIG. 4 is a cross-sectional schematic diagram of a trench device.

FIGS. 2A to 2E are cross-sectional diagrams showing the method of manufacturing SAC openings according to the embodiment of the present invention. Referring to FIG. 2A, first, a substrate 200 is provided. The substrate 200 has a plurality of device structures 202 and an underneath doped region 201. The top of the device structures 202 is higher than the surface of the substrate 200. Wherein, the substrate 200 is, for example, a P type substrate. The doped region 201 is, for example, an N-doped region and can be used as source region. Moreover, the device structures 202 can be gate structure, conductive wire structure or trench device. Furthermore, the gate structure is, for example, at least composed of a dielectric layer and a gate layer; the conductive wire structure, for example, is composed of at least a conductive layer. In addition, the trench device (as shown in FIG. 4) is disposed in the trench 402 and the trench 402 is disposed in the substrate 400. The trench device comprises a control gate 404, a pair of floating gates 406, a tunneling oxide layer 408, an inter-gate dielectric layer 410 and a source/drain region 412. Next, a dielectric layer 204, a conductive layer 206 and a patterned photoresist layer 208 are sequentially formed on the surfaces of the substrate 200 and the device structures 202. In one embodiment, the conductive layer 206 can be a multiple conductive layer which is composed by, for example, a polysilicon layer and a metal silicide layer on the polysilicon layer. The material of the metal silicide layer is, for example, tungsten silicide. The material of the first dielectric layer 204 is, for example, silicon oxide or silicon oxide/silicon nitride/silicon oxide or other suitable materials. In addition, a thin dielectric layer can be formed on the conductive layer 206 as a protection layer.

Figure 2B:
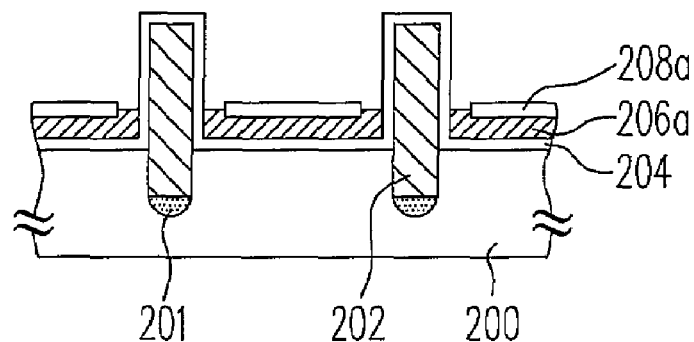

Next, referring to FIG. 2B, an etching process is performed by using the patterned photoresist layer 208 as the mask to remove a part of the conductive layer 206 on the top and sidewalls of the device structures 202. Accordingly, a conductive layer 206 with a part of exposed surface is formed and a part of the photoresist layer 208a still remains. Wherein, the etching process is, for example, a non-isotropic etching process.

Figure 2C:
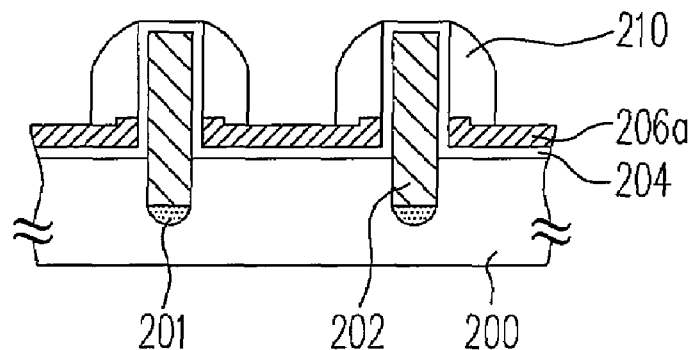

Next, referring to FIG. 2C, the photoresist layer 208a is removed. Then, a spacer 210 is formed on the exposed sidewalls of the device structure 202 and the exposed surface of the conductive layer 206. The spacer 210 covers the conductive layer 206. Wherein, the material of the spacer 210 is, for example, silicon nitride. The forming method of the spacer 210 is, for example: first, a silicon nitride layer is deposited on the substrate 200, then the spacer 210 is accordingly formed on the sidewalls of the device structure 202 and the upper side of the conductive layer 206 after the non-isotropic etching has been performed. It should be noted that in the process as shown in FIG. 2B, a part of the conductive layer 206 on the sidewalls of the device structure 202 has been etched off, therefore, in the process as shown in FIG. 2C, a bigger space is available for forming the thicker spacer 210.

Figure 2D:
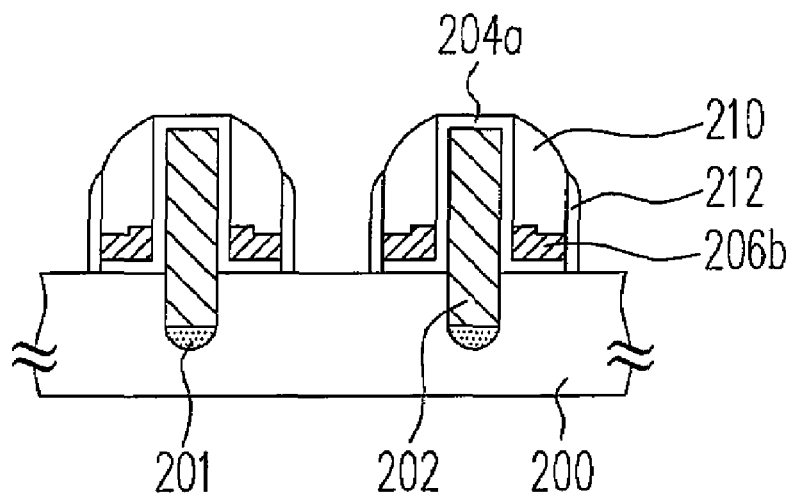

Next, referring to FIG. 2D, an etching process is performed by using the spacer layer 210 as the mask to remove the exposed conductive layer 206a so as to expose the substrate 200 and the remained conductive layer 206a is formed into a conductive layer 206b having exposed sidewall and a dielectric layer 204a is formed. Wherein, the etching process is, for example, a non-isotropic etching process. More particularly, as the top of the conductive layer 206b is covered by the previously formed thicker spacer 210, more protection is provided to the conductive spacer 206b in the subsequent manufacturing process. Next, a spacer 212 is formed on the exposed sidewall of the conductive spacer 206b. It is remarkable that as the spacer 210 is thicker, the spacer 212 formed in the process has perpendicular sidewalls.

Figure 2E:
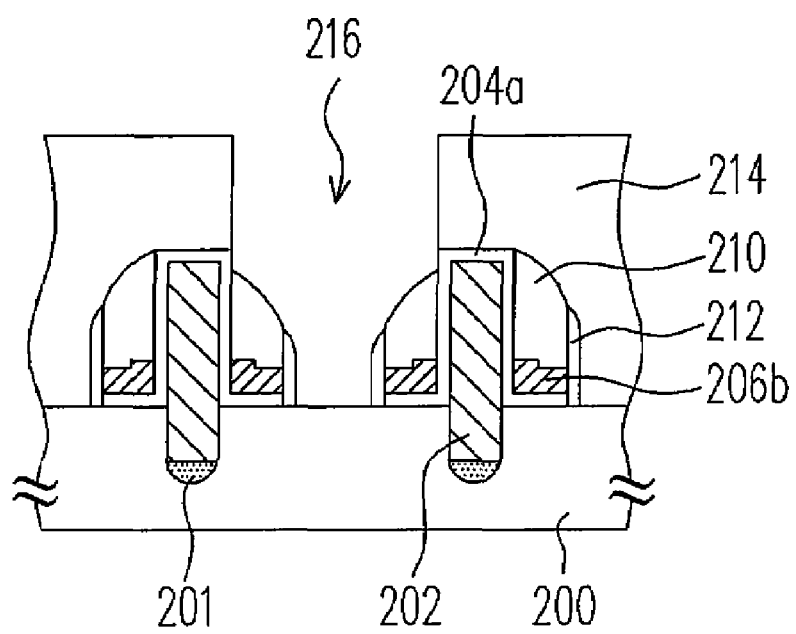

Next, referring to FIG. 2E, a dielectric layer 214 is formed on the substrate 200. Wherein, the material of the dielectric layer 214 is, for example, silicon oxide and the forming method is, for example, chemical vapor deposition (CVD) process. Next, an etching process is performed to form the contact opening 216 in the dielectric layer 214 and to expose the substrate 200. The etching process is, for example, a self-aligned etching process.

Particularly note that since a part of the conductive layer 206 on the sidewalls of the device structure 202 has been removed in the process as shown in FIG. 2B, a thicker spacer 210 can be formed in the process as shown in FIG. 2C. Therefore, in the process of manufacturing SAC openings as shown in FIG. 2E, the problem of the exposure of the conductive layer 206b is prevented; accordingly, the problem of short circuit resulting from the contact of the conductive spacer 206b and the conductive devices such as the sequentially formed contact openings can be avoided. Moreover, as the spacer 212 has more perpendicular sidewalls, the problem of exposure of the conductive spacer 206b in the process of manufacturing SAC openings as shown in FIG. 2E can be also eliminated.

The following is the description of the structure obtained from the method of the present invention.

Figure 3:
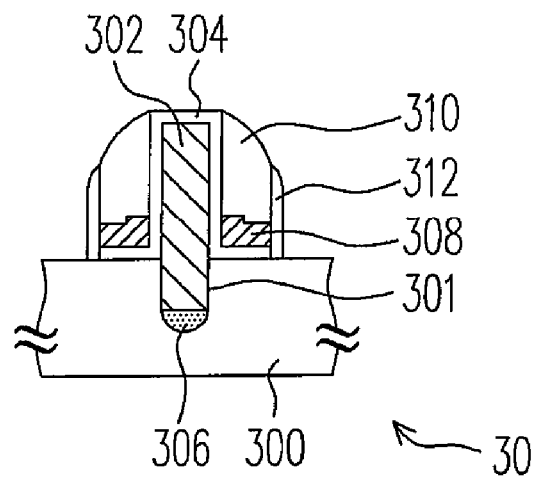
FIG. 3 is a cross-sectional schematic diagram of the semiconductor device as shown in the embodiment of the present invention.

FIG. 3 is a cross-sectional schematic diagram of the semiconductor device according to the embodiment of the present invention. Referring to FIG. 3, the semiconductor device 30 comprises a substrate 300, a device structure 302, a dielectric layer 304, a doped region 306, a conductive spacer 308 and a spacer 310.

Wherein, the substrate 300 comprising a trench 301 is, for example, a P type substrate. The device structure 302 is disposed in the trench 301 and the top of the device structure 302 is higher than the surface of the substrate 300. Wherein, the device structure 302 is, for example, a gate structure, a conductive wire structure or a trench device. The doped region 306 is provided to match the device structure 302 or to meet product requirement. The doped region 306 is disposed in the substrate 300 on the bottom of the device structure 302. The doped region 306 is, for example, the doped region having N type ions and can also be used as source region. The conductive spacer 308 is disposed on the lower part of the sidewalls of the device structure 302. The spacer 310 is disposed on the upper part of the sidewalls of the device structure 302 and covers the conductive spacer 308. The dielectric layer 304 is disposed between the conductive spacer 308 and the device structure 302, and also disposed between the conductive spacer 308 and the substrate 300.

In one embodiment of the present invention, the semiconductor device 30 further comprises a spacer 312 disposed on the sidewall of the conductive spacer 308. In one embodiment of the present invention, the material of the dielectric layer 304 is, for example, silicon oxide or silicon oxide/silicon nitride/silicon oxide; the material of the spacer 310 is, for example, silicon nitride; and the material of the conductive spacer 308 is, for example, multiple conductive layer such as a polysilicon layer and a metal silicide layer on the polysilicon layer. Wherein, the material of the metal silicide layer is, for example, tungsten silicide.

It is remarkable that the spacer 310 of the semiconductor device 30 has a larger thickness such that it provides more protection for the underneath conductive layer 308. That is, the spacer 310 can effectively protect the underneath conductive spacer 308 from being destroyed in the subsequent process of manufacturing contact openings using the semiconductor device 30.

In summary, in the processes of manufacturing SAC openings of the present invention, a part of the conductive layer on the top and the sidewalls of the device structures is removed before the spacer 210 as shown in FIG. 2C is formed. Accordingly, a bigger space is provided to form the thicker spacer. During the etching process for the SAC openings, the problem of exposure of the conductive layer underneath the spacers can be avoided which causes short circuit resulting from the contact of the conductive layer and other conductive devices. Moreover, the present invention improves the feasibility of reducing the size of the devices.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method of manufacturing self-aligned contact openings, comprising:
    providing a substrate having a plurality of device structures, wherein the top of the device structures is higher than the surface of the substrate;
    sequentially forming a first dielectric layer and a conductive layer on the surfaces of the substrate and the device structures;
    forming a mask layer on the conductive layer between two adjacent device structures;
    removing a part of the conductive layer on the top and the sidewalls of the device structures not covered by the mask layer;
    forming a plurality of first spacers on the sidewalls of the device structures;
    removing the conductive layer and the first dielectric layer by using the first spacer as the mask to expose the substrate and to form a plurality of conductive spacers; and
    forming a plurality of second spacers on the sidewalls of the conductive spacers.

2. The method according to claim 1, wherein the step of removing a part of the conductive layer on the top and the sidewalls of the device structures comprises performing a non-isotropic etching process.

3. The method according to claim 1, wherein the process of removing the conductive layer and the first dielectric layer comprises performing a non-isotropic etching process.

4. The method according to claim 1, wherein the conductive layer comprises a multiple conductive layer.

5. The method according to claim 4, wherein the multiple conductive layer comprises a polysilicon layer and a metal silicide layer on the polysilicon layer.

6. The method according to claim 5, wherein the material of the metal silicide layer comprises tungsten silicide.

7. The method according to claim 1, wherein the device structures are trench devices.

8. The method according to claim 1, wherein the material of the first spacers comprises silicon nitride.

9. The method according to claim 1, wherein the material of the first dielectric layer comprises silicon oxide or silicon oxide/silicon nitride/silicon oxide.

10. The method according to claim 1, further comprising forming a second dielectric layer on the substrate after the second spacers are formed.

11. The method according to claim 10, further comprising performing an etching process after the second dielectric layer is formed and forming a plurality of contact openings in the second dielectric layer, wherein, the contact openings are disposed between two adjacent device structures to expose the substrate, the first spacers and the second spacers.

12. The method according to claim 1, wherein the mask layer is a patterned photoresist layer.

13. The method according to claim 1, further comprising removing the mask layer before the first spacers are formed.

* * * * *